United States Patent [19]

Panaoussis

[11] Patent Number: 5,896,100

[45] Date of Patent: Apr. 20, 1999

[54] METHOD AND APPARATUS FOR ANALOG-TO-DIGITAL OR DIGITAL-TO-ANALOG CONVERSION

[75] Inventor: Spyros Panaoussis, Chicago, Ill.

[73] Assignee: Cennoid Technologies, Inc., Burr Ridge, Ill.

[21] Appl. No.: 08/783,371

[22] Filed: Jan. 13, 1997

Related U.S. Application Data

[63] Continuation of application No. 08/316,255, Sep. 30, 1994, Pat. No. 5,594,438.

[51] Int. Cl.$^6$ ...................................................... H03M 1/02
[52] U.S. Cl. .......................... 341/108; 341/161; 341/146
[58] Field of Search .................................. 341/146, 161, 341/162, 163, 108

[56] References Cited

U.S. PATENT DOCUMENTS

| | | | |
|---|---|---|---|
| 4,769,628 | 9/1988 | Hellerman | 341/162 |
| 4,994,808 | 2/1991 | Wichelman | 341/161 |
| 5,202,687 | 4/1993 | Distinti | 341/158 |

*Primary Examiner*—Howard L. Williams
*Attorney, Agent, or Firm*—Welsh & Katz, Ltd.

[57] ABSTRACT

An analog-to-digital converter circuit is disclosed that is capable of converting both positive and negative analog input signals, and that is capable of operating as either an analog-to-digital converter or a digital-to-analog converter. The converter includes a modifying filter, a series of substantially identical converter stages, and a restoring filter. An original reference signal is provided, coupled to a resistor array to provide a stage reference signal to each converter stage that is equivalent to the value of the bit of an N-bit binary word corresponding to that stage. An incoming analog signal is modified to ensure that it is positive before applying it in parallel to the converter stages. Each converter stage compares the modified analog signal to the sum of its own reference signal and the value of all stage reference signals for prior converter stages where the digital output of the stage was a binary "1." When the modified signal is larger than or equal to the stated sum, the converter stage outputs a binary "1", and when the modified signal is smaller than the sum, a binary "0" is output. In digital-to-analog mode, binary inputs to each stage determine the reference signals to be summed in order to produce an analog output. The restoring filter may be used to restore the original incoming analog signal, including its sign.

55 Claims, 5 Drawing Sheets

METHOD AND APPARATUS FOR ANALOG-TO-DIGITAL OR DIGITAL-TO-ANALOG CONVERSION

This is a continuation of application Ser. No. 08/316,255, filed Sep. 30, 1994, now U.S. Pat. No. 5,594,438.

FIELD OF THE INVENTION

This invention relates generally to analog-to-digital (A/D) converter circuitry, and specifically to high-speed conversion of analog signals. A/D circuitry is useful when data taken in a physical system, or other data that normally occurs in analog form, must be converted into digital form. In certain cases, A/D circuitry can also be used to convert a digital signal back to its analog form.

BACKGROUND OP THE INVENTION

There are many well-known methods of converting an analog input signal to a series of digital output signals, and of reversing the process to convert a series of digital input signals (a binary word) to an analog output signal. All such methods can be improved upon by reducing the number of components required, by reducing the time needed to convert a sampled signal, or by changing the circuit components so as to reduce component losses and the resulting inaccuracies associated with signal transfer, or by a combination of these methods.

It is therefore one object of the present invention to provide an A/D converter that requires few components, and is simple and inexpensive to construct.

It is another object of the present invention to provide an A/D converter that is equally accurate for positive and negative analog input signals.

It is another object of the present invention to provide an A/D converter that processes signals rapidly.

It is another object of the present invention to provide an A/D converter that produces a digital representation of the input signal without any diode losses.

It is yet another object of the present invention to provide an A/D converter constructed from substantially similar stages of circuitry.

It is yet another object of the present invention to provide an A/D converter having stages of circuitry that experience no diode losses.

It is yet another object of the present invention to provide an A/D converter that processes an input signal without using a clock.

It is yet another object of the present invention to provide an A/D converter having N stages that is cascadable.

It is still another object of the present invention to provide an A/D converter wherein the number of required components increases proportionately, not exponentially, with the increase in bit resolution.

It is finally an object of the present invention to provide an A/D converter that can also be used as a digital-to-analog (D/A) converter having all of the advantages set forth above.

SUMMARY OF THE INVENTION

To achieve these and other objects, the A/D converter of the present invention provides a modifying filter, a restoring filter, and a plurality of N converter stages, where N is an integer. The converter stages are connected in parallel such that each stage receives a modified analog input signal to be converted, and a predetermined reference signal unique to the stage. Each stage further receives an analog stage input signal from the previous stage. Applying these inputs, each converter stage generates an analog stage output signal and a digital stage output signal, where the value of each output signal is determined by the activation of one of two switching modes.

Each of the N converter stages corresponds to a bit in the binary word to be created, with the first stage corresponding to the most significant bit, the second stage corresponding to the second most significant bit, and so on. It follows that the Nth converter stage corresponds to the least significant bit. Accordingly, the stage reference signal for each stage has a magnitude equal to the value of the bit that corresponds to the stage. For reasons that will become clear, the sign of each stage reference signal is negative.

The analog stage input signal received by each converter stage is equal to the analog stage output signal generated by the preceding stage, except that for the first stage, the analog stage input signal is equal to ground (zero). Except for the first stage, the signal that is passed from the preceding stage (the analog stage input signal) is always a combination of the values of one or more stage reference signals, and thus a sum of one or more bit values.

Each stage has a stage reference terminal for receiving the stage reference signal described above. This signal is used to generate a "difference signal" for the stage, where the difference signal is equal to the sum of the values of the stage input signal and the stage reference signal. The "difference signal" is so called because it is arrived at by subtraction of a negative reference signal. The difference signal is compared with the modified analog input signal (the signal to be converted), and the first switching mode is activated when the modified analog input signal is the smaller of the two signals. If the modified analog input signal is greater than or equal to the difference signal, the second switching mode is activated.

The first switching mode causes the analog stage output signal to be equal to the stage input signal, and the stage bit output to assume one of its two binary states, conventionally a "0". Thus, any converter stage that outputs a binary "0" has not added the value of its stage reference signal to the sum of previous reference signals (or zero) that was passed to it as the analog stage input signal in order to create the analog stage output signal that is passed to the next converter stage. Rather, it passes along the analog stage input signal it received, which is equal to the sum of the reference signals corresponding to all previous converter stages having a digital stage output signal equal to a binary "1."

The second switching mode causes the stage output signal to be equal to the difference signal, and the stage bit output to assume the other of its two binary states, conventionally a "1". Thus, any converter stage that outputs a binary "1", has added the value of its stage reference signal to the sum of previous reference signals that was passed to it as the analog stage input signal (or zero) in order to create the analog stage output signal that is passed to the next stage.

Each digital stage output is thus one bit of an N-bit binary word, where the binary word digitally represents the amplitude of the modified analog input signal. As each consecutive converter stage adds or withholds its reference signal value from the analog stage output signal that is passed on, each consecutive analog stage output signal approaches the value of the modified analog input signal that is being converted. Constant comparison of the Nth analog stage output signal with the modified analog input signal will signal the point in time when the analog to digital conversion is complete.

By providing separate digital stage input terminals and signals to each converter stage, and by enabling the digital inputs to control the switching modes, the A/D converter stage operation just described can perform D/A conversion of digital signals. In such a D/A mode of operation, the most significant bit of the digital signal to be converted must be applied at the first stage of the converter, the second most significant bit must be applied at the second stage, and so on. The stage analog output at the Nth converter stage will be the desired analog conversion signal.

When the A/D converter is operated in its A/D mode, the original (not modified) analog signal that is input to the converter must be adjusted by a modifying filter before it is applied to the converter stages. The modification consists of shifting any negative portions of the analog input signal in a positive direction by a predetermined, fixed amount. This shift creates a completely positive signal for application to the multi-stage converter circuitry just described. A flag bit (or sign bit) output by the modifying filter circuitry is set to indicate the sign of the signal being processed.

A second filter is provided for restoring the analog signal. This restoring filter is used when it is desired to recreate the original analog input signal from its digital representation, including the sign bit. It may also be used when the sign of a digital input signal can otherwise be made available. When the restoring filter is used, the analog output signal of the final converter stage, the original reference voltage, and the sign bit serve as inputs. The restoring filter then recreates and outputs the original analog input signal, or an analog signal that is appropriately positive or negative.

PREFERRED EMBODIMENT

Figure 1:
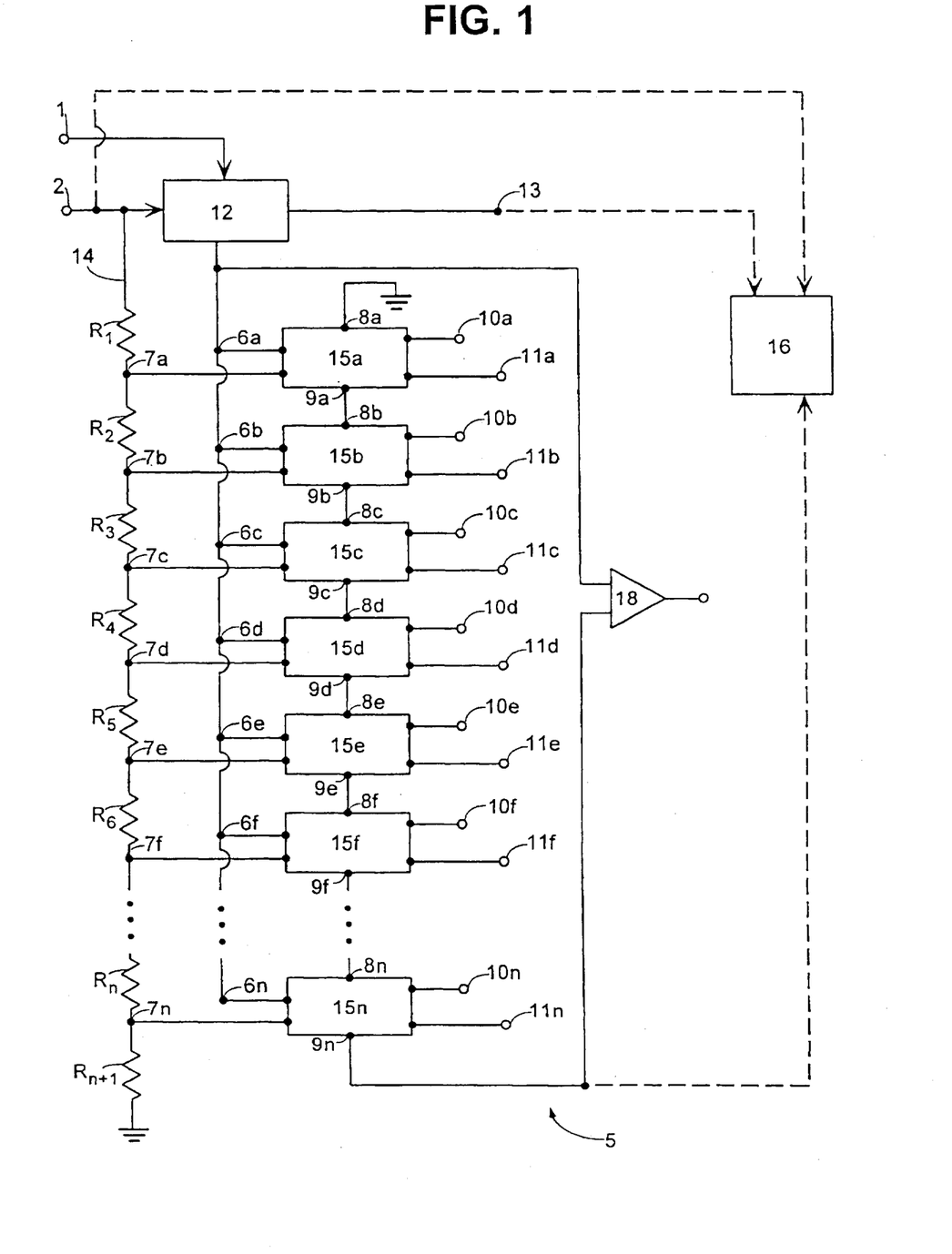
FIG. 1 is a schematic circuit representation of an N-bit A/D converter constructed in accordance with the present invention.

Rapid conversion of either a positive or negative analog signal to an N-bit digital representation of that signal, plus a one-bit representation of the sign of the signal, is provided by the operation of the N-stage A/D converter 5 of FIG. 1, as operated in its A/D mode. Similarly rapid conversion of an N-bit digital signal to its analog equivalent may be provided by the operation of the same converter 5 of FIG. 1 in its D/A mode. When the sign of an N-bit digital signal is available, the digital signal can be converted to the appropriate positive or negative analog signal by an optional restoring filter.

Note that in FIG. 1 and throughout all of the drawings, like reference numerals identify corresponding or identical parts, and small letters distinguish between those identical or corresponding parts as they appear at different converter stages 15 of the converter 5. The letter R with a subscript is used to identify resistors in FIG. 1 in order to show that the number of resistors is unknown (but is related to N), and the resistors have different values.

FIG. 1 is a block diagram of the multiple stage A/D converter 5 of the present invention. In order to provide a linear or proportional relationship between the bit resolution and the component count of the A/D converter, each of the N stages of the converter 5 is identical to the other stages. Identity of converter stages insures a linear relationship between the quantity of components needed to build an A/D converter according to the present invention, and its digital outputs (and inputs). As increased precision is desired, such a linear relationship becomes more important, because it serves to minimize both component costs and circuit complexity.

With continued reference to FIG. 1, the multiple stages 15a–15n of the A/D converter are connected to a comparator 18, as well as a modifying filter 12 and a restoring filter 16. The restoring filter 16 is connected by dotted lines to the rest of the A/D converter blocks to indicate that it is optional. The converter 5 is provided with an analog input terminal 1 for receiving an original analog input signal $V_{IN}$, a reference input terminal 2 for receiving an original reference signal $-V_{REF}$, and digital input terminals 11a–11n. When the converter is used in its A/D mode, the digital input terminals 11a–11n are disabled. When the converter is used in its D/A mode, the original analog input terminal 1, and thus the signal at point A, are effectively disabled.

When it operates in its A/D mode, the A/D converter generates digital stage output signals D1–Dn that appear at the digital stage output terminals 10a–10n. When it operates in its D/A mode, the converter generates an analog output signal $V_{sum}$ that appears at the analog stage output terminal 9n for the Nth converter stage.

A/D Operation

The A/D mode of operation of the converter 5 of FIG. 1 is described in detail first, but some comments are included regarding D/A operation.

The A/D converter 5 includes a first converter stage 15a, a second converter stage 15b, a third converter stage 15c, and an Nth converter stage, 15n, where N is an integer. The converter stages are connected in parallel. Each stage has an analog input terminal 6 for receiving the modified analog input signal $V_m$, and each stage has a reference terminal 7 for receiving a reference signal $-V_Ra$ through $-V_Rn$ that is unique to the stage ("the stage reference signal"). Each stage has an input terminal 8 for receiving an analog input signal $V_Sa–V_Sn$ that is unique to the stage ("the analog stage input signal"). Each stage also has a digital stage input terminal 11 that is disabled when the converter is operated in its A/D mode.

Each stage 15 of the converter 5 generates a unique analog output signal, and a unique digital output signal. These signals appear at the analog stage output terminals 9a–9n and the digital stage output terminals 10a–10n respectively. With reference to FIG. 1, the (analog) signals at the following pairs of terminals are equal: 9a, 8b; 9b, 8c; 9c, 8d; 9d, 8e; and 9e, 8f.

When the converter operates in D/A mode, the analog stage output signal $V_{sum}$ for the Nth converter stage, appearing (immediately) at the analog stage output terminal 9n for the Nth stage, constitutes the completed analog conversion signal. When the converter operates in A/D mode, $V_{sum}$ may be used to determine the point in time when the conversion of the original analog input signal $V_{in}$ to its digital representation is complete. When the conversion is complete, $V_{sum}$ will substantially equal the modified analog input signal $V_m$ appearing at point A. The two signals may be constantly compared using the comparator 18 of FIG. 1. When the signals are equal, the conversion is complete, and the comparator output becomes high.

The original reference signal $-V_{REF}$ at terminal 2 in FIG. 1 is divided into stage reference signals $-V_R a$ through $-V_R n$ by the voltage divider circuit 14 consisting of N+1 resistors $R_1$ to $R_{N+1}$. In order for the A/D converter of the present invention to operate correctly, the original reference signal $-V_{REF}$ must be negative, and its magnitude must be greater than the magnitude of the input analog signal $V_{in}$. In the preferred embodiment of the invention, the original reference signal is preferably a multiple of the Nth power of two.

The resistors $R_2$ to $R_N$ are each half the value of the preceding resistor, with the value of resistor $R_1$ preferably equal to a multiple of the Nth power of two. The value of the last resistor $R_{N+1}$ is equal to the value of the second last resistor $R_N$. For example, for an eight bit converter, the reference signal $-V_{REF}$ might be $-2.56$ volts, and the resistor values $R_1$ to $R_{N+1}$ might be those given in Table 1.

TABLE 1

| Resistor | Value (ohm) |
|---|---|
| $R_1$ | 256 |
| $R_2$ | 128 |
| $R_3$ | 64 |
| $R_4$ | 32 |
| $R_5$ | 16 |
| $R_6$ | 8 |
| $R_7$ | 4 |
| $R_8$ | 2 |
| $R_9$ | 1 |

For this example, the stage reference signal at terminal 7a for the first stage 15a would be approximately $\frac{1}{2}(-V_{REF})$, or $-1.28$ volts. The stage reference signal at terminal 7b for the second stage 15b would be approximately half of the preceding stage reference signal: $(\frac{1}{2})(\frac{1}{2})(-V_{REF})$ or $-0.640$ volts. Similar computations would reveal the stage reference signals at the remaining stage reference terminals 7c–7n.

Figure 2:
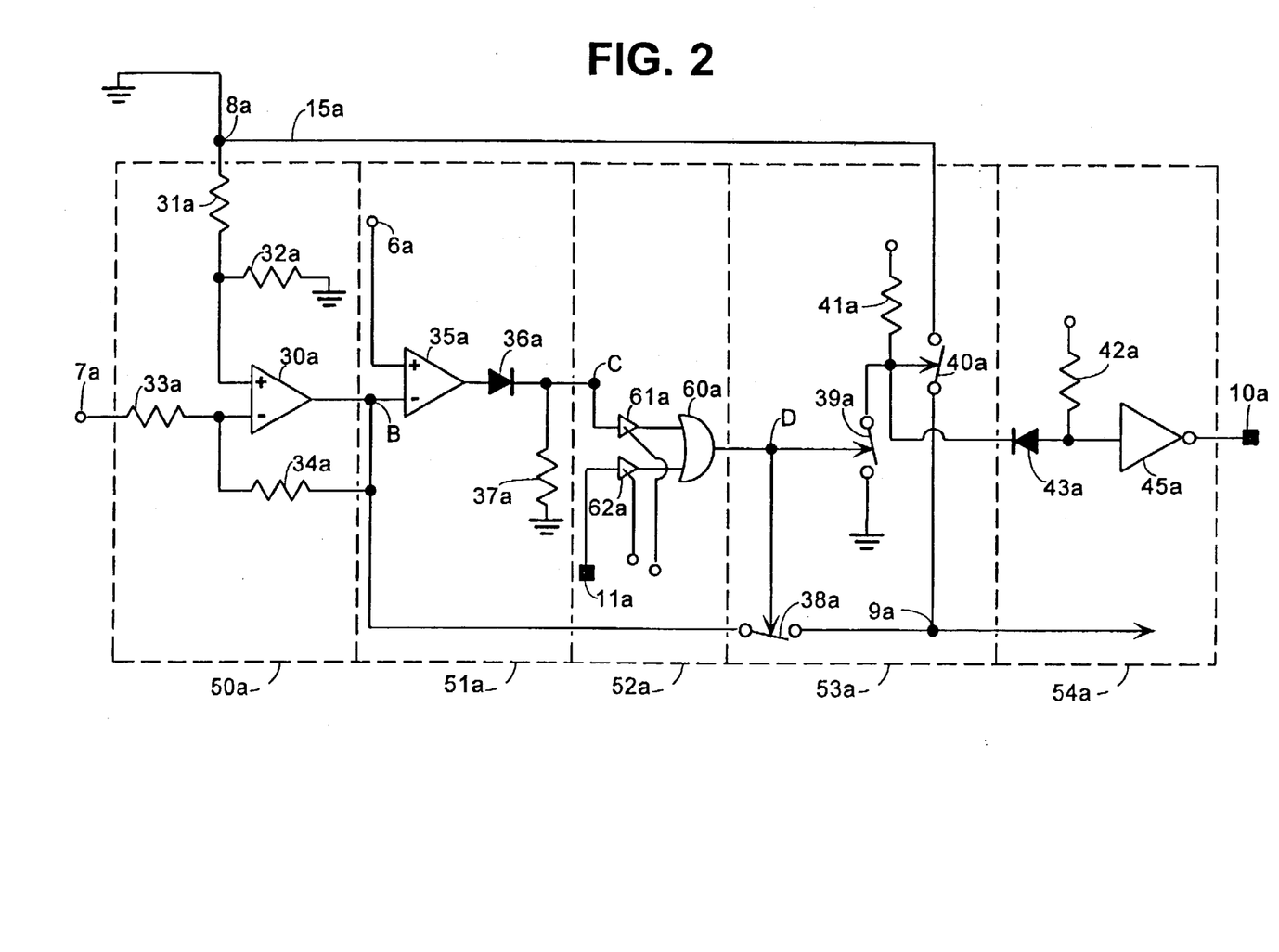
FIG. 2 is a more detailed schematic circuit representation of one stage of the A/D converter shown in FIG. 1.

Referring now to FIG. 2, the first stage 15a of the preferred embodiment of the present invention is illustrated in detail, and dotted lines are used to separate different circuits within the stage. The analog stage input signal $V_S a$ at terminal 8a and the stage reference signal $-V_R a$ at terminal 7a are passed to the input terminals of the differential amplifier circuit 50a consisting of matching resistors 31a–34a and operational amplifier 30a. The resulting difference signal $V_D a$ at point B may be represented as:

$$V_D a = A(V_S a - (-V_R a)), \text{ or}$$

$$V_D a = A(V_S a + V_R a)$$

where A is a constant that is determined by the value of the matching resistors 32a–34a of the differential amplifier circuit. The constant A is equal to 1 in the preferred embodiment of this invention.

With continued reference to FIG. 2, the original reference voltage $-V_{REF}$ at the original reference terminal 2 and the stage reference voltages $-V_R a$ through $-V_R n$ at the stage reference terminals 7a–7n are negative. As a result, the differential operator circuit 50a is used to find the positive sum of the magnitudes of the analog stage input signal $V_S a$ (appearing at the analog stage input terminal 8a) and the stage reference signal $V_R a$ (appearing at terminal 7a):

$$V_D a = V_S a + V_R a$$

where $V_D a$ is a positive signal. The output signal $V_D a$ of the differential amplifier circuit 50a is referred to herein as the difference signal $V_D$, however, as demonstrated above, it is really the sum of selected reference signals.

In FIG. 2, the difference signal $V_D a$ appearing at point B and the modified analog input signal $V_m$ appearing at terminal 6a are applied to the inputs of the comparator circuit 51a consisting of an operational amplifier 35a, a diode 36a and a resistor 37a. The output of the comparator circuit 51a may be found at point C in FIG. 2. The signal at point C will be high (+Vcc) if the modified analog input signal $V_m$ is greater than or equal to the difference signal $V_D a$. The relationships between the inputs and the output of the comparator circuit 51a are set forth in Table 2.

TABLE 2

| Relationship of Inputs | Signal at Point C |
|---|---|
| $V_D a > V_m$ | 0 |
| $V_D a < V_m$ | +Vcc |
| $V_D a = V_m$ | +Vcc |

The comparator output (the signal at point C) is passed to a combiner circuit 52a consisting of an OR gate 60a and two buffers 61a and 62a. The combiner circuit makes it possible for the A/D converter to be operated in either its A/D mode or its D/A mode. The first buffer 61a of the combiner circuit is connected between point C and the first input to the OR gate 60a. The second buffer 62a is connected between the digital input terminal 11a and the second input to the OR gate 60a. The first buffer 61a is enabled (allows a signal to pass) and the second buffer 62a is disabled (grounded) when the converter operates in its A/D mode. When the converter operates in its D/A mode, buffer 61a must be disabled and buffer 62a must be enabled.

The output of the combiner circuit is passed to the switching circuit 53a consisting of switches 38a, 39a and 40a. The switches 38a, 39a and 40a are digitally controlled, but capable of passing analog signals. When the converter 5 is operating in its A/D mode, the OR gate 60a passes the signal at point C on to point D. Thus the signal at point C serves to control the digital switching circuit 53a. When the signal at point D is low, switches 38a, 39a and 40a are configured in accordance with a first switching mode. When the signal at point D is high, switches 38a, 39a and 40a are configured in accordance with a second switching mode. In the first and second switching modes, the switches 38a, 39a and 40a are either closed or open according to Table 3.

TABLE 3

| Signal at D | Switching Mode | Switch 38a | Switch 39a | Switch 40a |
|---|---|---|---|---|
| 0 | 1 | open | open | closed |
| 1 | 2 | closed | closed | open |

As reference to FIG. 2 and Table 3 demonstrate, when switching mode one is employed, the analog stage input signal $V_S a$, found at terminal 8a, is passed to the analog stage output terminal 9a, and hence on to the next converter stage 15. For switching mode one the signal at the digital stage output terminal 10a is a binary "0". Any converter stage that outputs a binary "0" does not pass an analog signal that includes the value of its own stage reference signal. Rather, the stage outputting a binary "0" passes along the same analog stage input signal it received, which is equal to the sum of all previous reference signals corresponding to converter stages that had a digital stage output of "1."

When switching mode two is employed, the difference signal $V_D a$, found at point B, is passed to the analog stage output terminal 9a and hence on to the next converter stage 15. For the second switching mode, the signal at the digital stage output terminal is a binary "1". Any converter stage that outputs a binary "1" also passes an analog signal to the following stage that is the sum of its own stage reference signal, plus the sum of all of the stage reference signals for all of the previous stages outputting a binary "1".

Table 4 sets forth the effect of the switching mode on the signals at the analog stage output terminal 9a and the digital stage output terminal 10a.

TABLE 4

| Point D | Switching Mode | Switch 38a | Switch 39a | Switch 40a | Digital Stage Output 10a | Stage Output 9a |
|---|---|---|---|---|---|---|
| 0 | 1 | open | open | closed | 0 | $V_s a$ |
| 1 | 2 | closed | closed | open | 1 | $V_D a$ |

The adaptor circuit 54a in FIG. 2 consists of the diode 43a, resistor 42a, and NOT gate 45a. The adaptor circuit adapts the high voltage signals from switching circuit 53a to a low voltage environment, enabling a binary "1" or "0" to be output at stage digital output terminal 10a.

Circuits 50a–53a operate to effectively reduce signal error and conversion time. The circuits are constructed such that, if the bit of the relevant converter stage 15a is not used in the binary representation of the analog signal (i.e., the bit output is a binary zero), the active circuit components are kept out of the signal path entirely, eliminating any possible loss of signal or time. Even if the bit of the relevant converter stage is used (i.e., the bit output is a binary 1), only the operational amplifier 30a acts on the signal that is passed to the next stage, and any signal loss is de minimis. The number of stages 15a–15n of the converter 5 that are considered "active" for a particular analog input signal $V_{in}$ depends on the value of that signal, and on its digital representation. Only where the bit output of a stage is a binary "1" did the circuits of the corresponding stage "act" on the signal.

The construction of the A/D converter 5 also serves to ensure the integrity of the modified analog input signal $V_m$ (located at point A in FIG. 1). This signal is not operated on by any active circuit components before it is input to each converter stage 15a–15n. Thus each converter stage receives a "clean" modified analog input signal $V_{in}$ for comparison with the difference signal (found, e.g., at point B in FIG. 2). Any signal error associated with the comparison is limited to the error, if any, associated with the difference signal.

Figure 3:
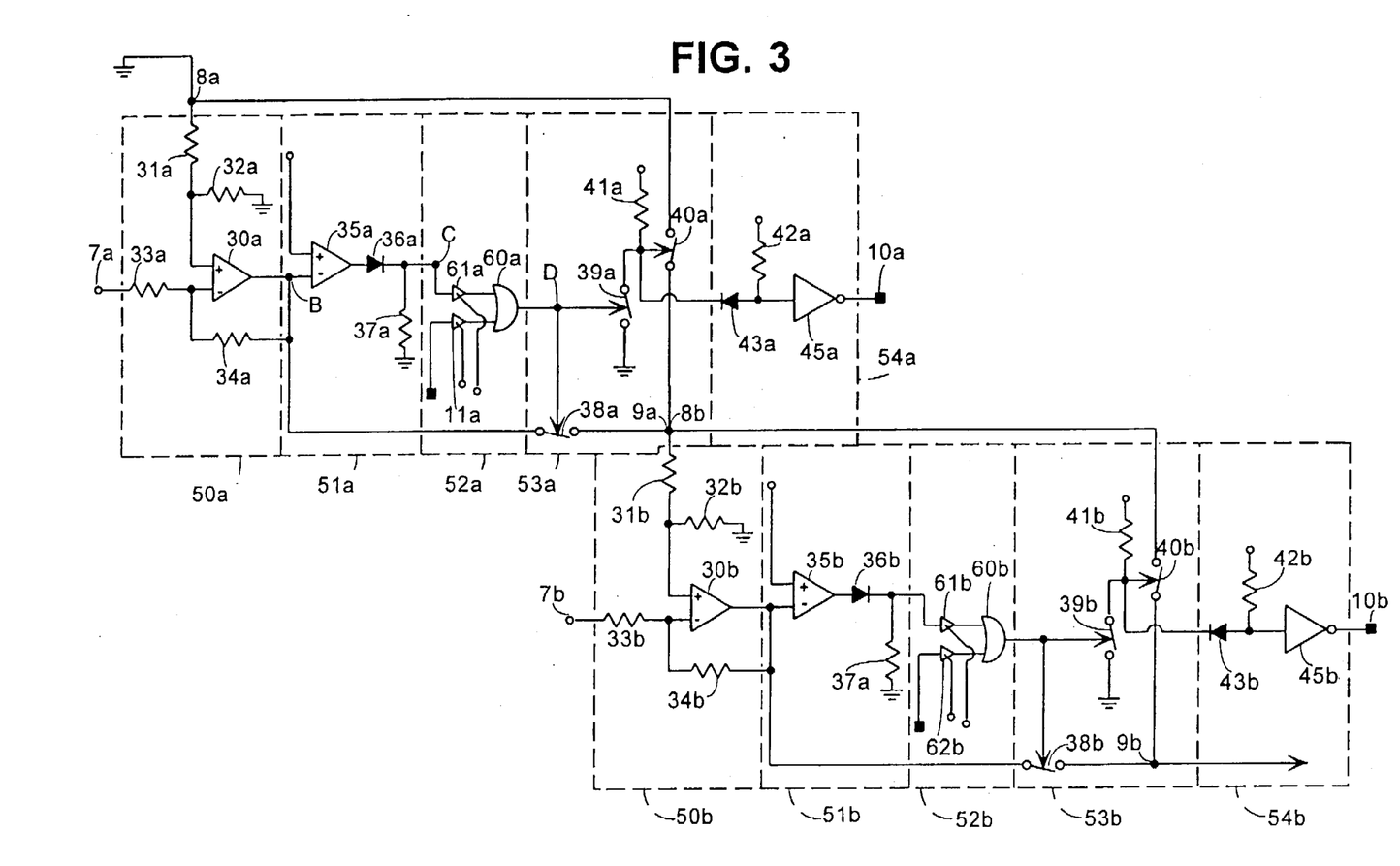
FIG. 3 is a detailed schematic circuit representation of two stages of the A/D converter shown in FIG. 1.

FIG. 3 illustrates a second stage 15b added to the first stage 15a of the A/D converter 5 of the present invention. The signal $V_O a$ at the analog stage output terminal 9a of the first stage is applied at the analog stage input terminal 8b of the second stage. Thus the analog stage output signal $V_O a$ for the first converter stage serves as the stage input signal $V_S b$ to the second converter stage. The analog stage input signal $V_S b$ and the stage reference signal $-V_R b$ for the second stage are fed to the differential amplifier circuit 50b of that stage. As explained for the first stage 15a above, the differential operator circuit 50b is used to find the positive sum of the analog stage input signal $V_S b$ and the magnitude $V_R b$ of the stage reference signal $-V_R b$:

$$V_D b = V_S b + V_R b,$$

and $V_D b$ is a positive signal. The remainder of the second stage 15b of the A/D converter 5 operates identically to the equivalent portions of the first stage 15a of the converter described previously. The output D2 at the digital stage output terminal 10a for the second stage indicates whether or not the common input signal $V_m$ is less than the sum of $V_S b$ and $V_R b$. When it is less, the digital stage output D2 is low (a binary "0"), otherwise the digital output is high, (a binary "1"). When the digital output D2 is "0", the stage output $V_O b$ equal to the stage input $V_S b$; otherwise, the stage output is equal to the difference signal for the second stage $V_D b$.

When the converter 5 operates in its A/D mode, the output D1 at the digital stage output terminal 10a represents the most significant digital bit in the binary word D1–Dn that ultimately represents the value of the modified analog input signal. The output D2 at the digital stage output terminal 10b for the second stage represents the second most significant bit in the binary word, and so on for the remaining digital stage outputs. The output Dn appearing at the digital stage output terminal 10n for the last (Nth) stage represents the least significant bit.

Each of the additional stages 15c–15n of the A/D converter 5 operates in the same way as the second stage 15b described above. The analog stage output voltage $V_{sum}$ for the final stage 15n, however, is not input to an additional converter stage for obvious reasons. Rather, the stage output for the final stage may be input to a comparator 18, and may be constantly compared with the common input voltage $V_m$. When the two signals are equal, the output $V_2$ of the comparator signals a completion of the conversion of the original analog signal to a binary word. By the novel construction of the converter stages 15a–15n, the analog stage output signal $V_O$ becomes incrementally closer to the value of $V_m$ at each stage. Thus, comparison of the final analog stage output signal $V_{sum}$ with the common input signal yields an answer to the question whether the conversion of the common input signal $V_m$ to its digital equivalent D1–Dn is complete.

Note that the converter described here requires only one comparator 35 per stage 15, and per digital bit D. Conversely, the number of converters needed for a conventional flash converter, as well as the expense and complexity associated with the same, increase exponentially with the number of bits of digital output (resolution) desired.

Figure 4:
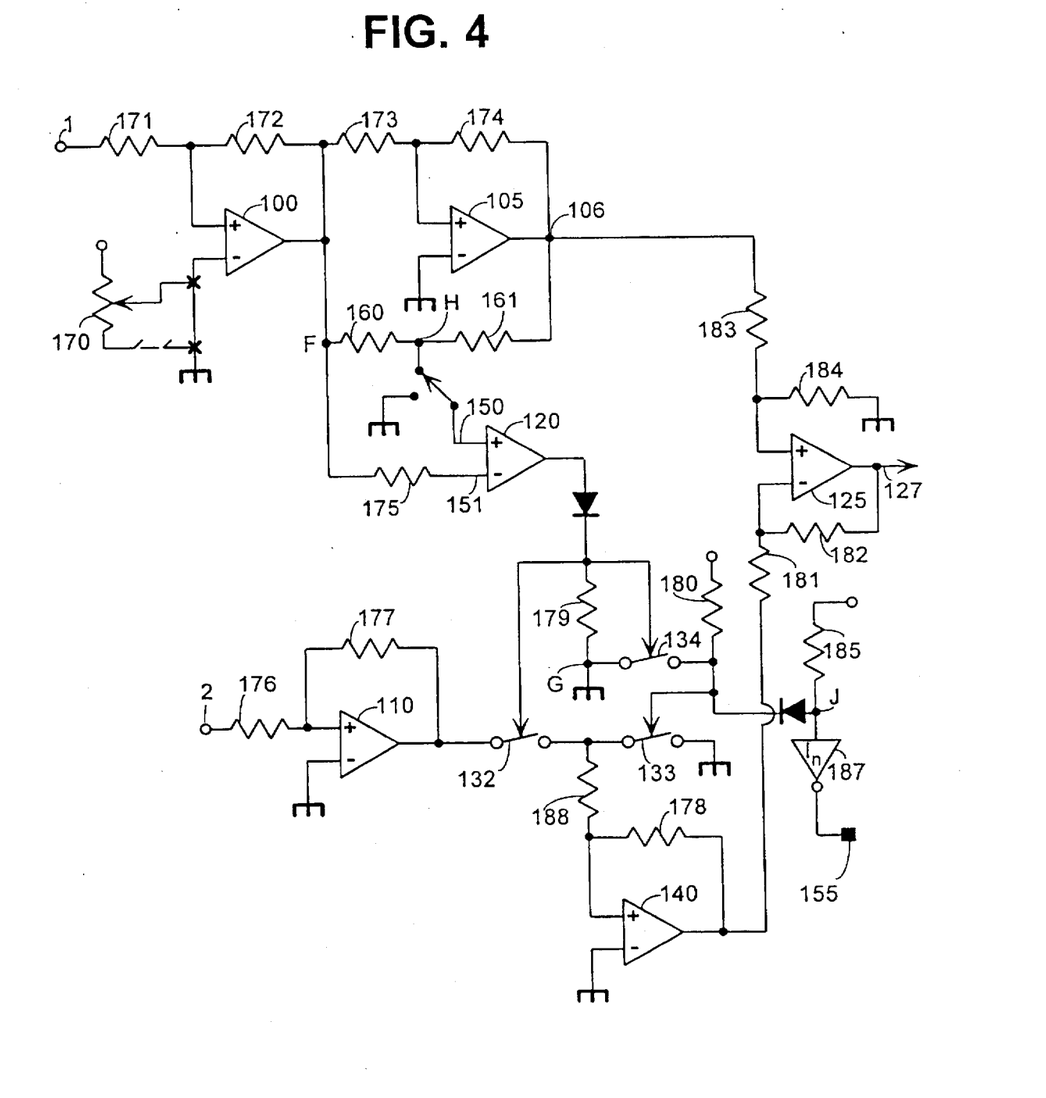
FIG. 4 is a more detailed schematic circuit representation of the modifying filter portion of FIG. 1.

FIG. 4 is a detailed drawing of the modifying filter 12 of FIG. 1, which operates on the signal appearing at the original analog input terminal 1 to produce the modified analog input signal $V_m$ appearing at point A (FIG. 1) as well as at stage analog input terminals 6a–5n. As shown in FIG. 4, the modifying filter 12 is provided at its first input terminal 1 with the original analog input signal $V_{in}$, and at its filter reference input terminal 2, with the original reference signal $-V_{REF}$. The original reference signal $-V_{REF}$ must have a negative sign, and must have a magnitude greater than the magnitude of any analog input signal $V_{in}$ applied to terminal 1.

Referring to FIG. 4, the original analog input signal $V_{in}$ at the input terminal 1 is inverted by the first inverter 100. The variable resistor 170 is used to center the original analog input signal $V_{in}$. The inverted signal $V_T$ at point F is compared to ground (zero) by comparator 120. Comparator 120 has two terminals, the reference terminal 150, and the inverting terminal 151. As illustrated in FIG. 4, an operator could choose to connect the inverting terminal 151 to either ground or point H. Point H is located exactly between the outputs (as passed through equivalent resistors 160, 161) of the first and second inverters 100 and 105. The signal at this midpoint H will always be zero.

When the inverted signal $V_T$ at point F is negative (meaning the original analog input signal $V_{in}$ is positive), the output of the comparator 120 taken at point G is a binary low or "0". When the inverted signal $V_T$ at point F is positive (meaning the input signal $V_{in}$ is negative) the output of the comparator 120 taken at point G is a binary high, or a "1". Note that due to operation of the second inverter 105, the original analog input signal $V_{in}$ is restored at the output terminal 106 of the second inverter 105.

When the comparator output $V_B$ taken at point G is a binary "0", the switches 132, 133 and 134 are activated such that (1) the differential amplifier 125 subtracts ground (zero volts) from the original analog input signal $V_{in}$ to obtain a signal $V_m$ at the output terminal 127 of amplifier 125 that is equal to the original analog input signal $V_{in}$, and (2) the signal Q1 at the flag bit (sign bit) output terminal 155 is low (a binary "0"). The signal $V_m$ appearing at the output terminal 127 of amplifier 125 is the modified analog input signal appearing at point B, and at the modified analog input terminals 6a–5n, in FIG. 1.

When the comparator output $V_B$ taken at point G is a binary "1" (meaning the input analog signal $V_{in}$ is negative) switches 132, 133 and 134 are activated such that (1) the differential amplifier 125 subtracts the original reference signal $-V_{REF}$ from the original analog input signal $V_{in}$, and (2) the signal Q1 at the flag bit (sign bit) output terminal 155 is high (a binary "1"). Since the reference signal $-V_{REF}$ is a negative number with a magnitude larger than that of any analog input signal $V_{in}$, subtracting the reference signal $-V_{REF}$ from a negative analog input signal results in a positive value. Thus the modified analog input signal $V_m$ at output terminal 127 (and at point B in FIG. 1) will always have a value greater than zero.

The conditions just described are more clearly set forth in Table 5.

TABLE 5

| $V_{in}$ | $V_T$ | Point G | Switch 132 | Switch 133 | Switch 134 | Op. Amp. 125 | $V_m$ | Q1 |
|---|---|---|---|---|---|---|---|---|
| + | − | 0 | Open | Closed | Open | $V_{in} - 0$ | $V_{in}$ | 0 |
| − | + | 1 | Closed | Open | Closed | $V_{in} - (-V_{REF})$ | $V_{in}+V_{REF}$ | 1 |

Use of the modifying filter 12 described here insures that the common analog signal applied to each stage of the A/D converter is positive, even when the analog input signal $V_{in}$ is negative. This modifying filter avoids the diodes used in prior art filter circuits to separate positive from negative input signals, and the accompanying significant losses of signal across the diodes.

The signal Q1 at the flag bit (sign bit) output terminal 155 indicates, for each analog signal converted, whether it is negative (Q1=1) or positive (Q1=0). In order for the A/D converter to operate in either its D/A or A/D mode, the flag bit output terminal 155 should be capable of being enabled and disabled with an OR gate and buffer combination similar to that shown in FIG. 2 (at point C). When the converter operates in its D/A mode, and no sign bit signal is available, the signal at the sign bit terminal should be disabled. When a sign bit signal is available, whether from a previous A/D conversion, or from some other source, the sign bit signal should be enabled.

D/A Conversion

With reference to FIGS. 1 and 2, when the converter of the present invention operates in D/A mode, the modifying filter 12 is not used, the modified analog input terminals 6a–6n for each stage are disabled by grounding the signal at point C, and the digital stage input terminals 11a–11n are enabled.

In order to convert an N bit digital signal to an analog signal, the N bit values $D1_{IN}$ through $DN_{IN}$ are applied at the digital stage input terminals 11a–11n in FIGS. 1 and 2. The most significant bit value $D1_{IN}$ is applied at the first such terminal 11a, and the remaining bit values $D2_{IN}$ through $DN_{IN}$ are applied in descending order to the remaining terminals 11b–11n. Since the signal at point C in FIG. 2 is grounded, the signal at point D and thus the operation of the switching circuit 53a of FIG. 2 will be controlled by the signal $D1_{IN}$ at the digital stage input terminal 11a.

Referring to FIG. 2, when $D1_{IN}$ is a binary "0", the output of the OR gate 60a taken at point D is also a binary "0", and the first switching mode is enabled. When $D1_{IN}$ is a binary "1", the output of the OR gate 60a taken at point D is also a binary "1", and the second switching mode is enabled. The operation of the switching circuit 53 and the resulting analog stage output signal appearing at terminal 9 for each converter stage are set forth by Table 4.

As indicated by Table 4, when the first switching mode is invoked, the analog stage input signal is passed to the stage output terminal. Thus the signal that is passed on is equal to the positive sum of the stage reference voltages for all of the preceding stages that received a digital "1" input. Similarly, when the second switching mode is invoked, the difference signal at point B is passed to the stage output terminal. Thus the signal that is passed on is the sum of the value of the stage reference signal for the current stage, plus the sum of the stage reference signals of all previous converter stages that received a binary "1" as a digital input. The analog signal $V_{sum}$ that is output at the final stage 15n of the converter is the completed analog representation of the digital input signals.

Figure 5:
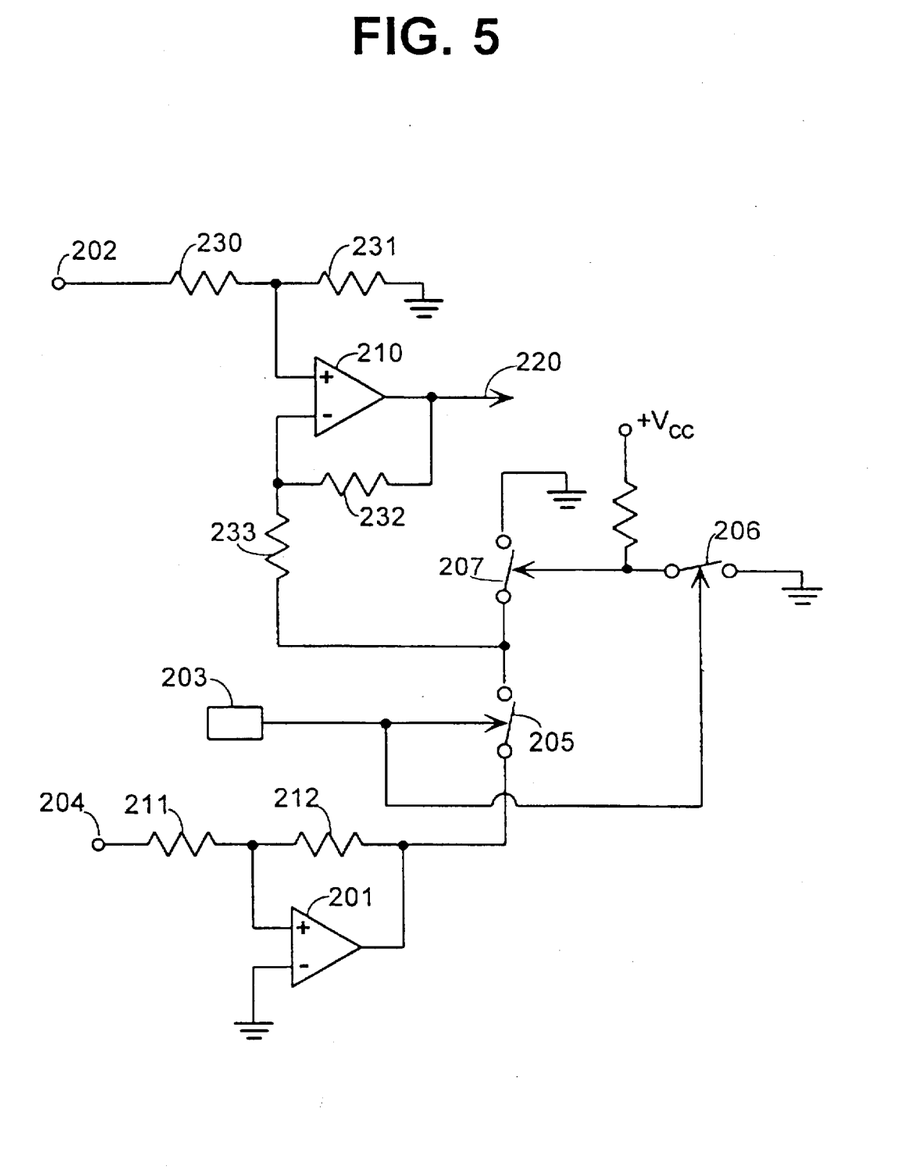
FIG. 5 is a schematic circuit representation of a restoring filter that may be used with the converter shown in FIG. 1.

FIG. 5 illustrates an optional restoring filter 16 that may be used to restore the input signal $V_{in}$ when the converter stages are used to convert the digital representation D1–Dn of a modified input voltage $V_m$ back to the analog signal it represents. When restoring filter 16 is not used, operation of the A/D converter in its D/A mode will yield an analog output signal $V_{sum}$ that is always positive like the modified analog input signal $V_m$ appearing at point A in FIG. 1.

The restoring filter 16 of FIG. 5 has an input terminal 202 that receives the modified analog input signal $V_m$, a digital input terminal 203 that receives the sign bit Q1, and a reference terminal 204 that receives the original reference signal $-V_{REF}$. The modified analog input signal is input to an operational amplifier 210 that functions as a differential amplifier due to matching resistors 230–233. Either ground (zero) or the inverted original reference signal is subtracted from the modified analog input signal at the differential amplifier 210, depending on the value of the sign bit Q1. The sign bit controls the digital switches 205–207 such that when the sign bit is zero, ground is subtracted from the modified analog input signal $V_m$ and when the sign bit is one, the inverted reference signal $V_{REF}$ is subtracted from the modified analog input signal $V_m$. Thus the output signal $V_{out}$ of the restoring filter 16, appearing at terminal 220, is determined according to Table 6.

TABLE 6

| $V_{in}$ | Q1 | Switch 205 | Switch 206 | Switch 207 | $V_{out}$ |
|---|---|---|---|---|---|
| + | 0 | Closed | Open | Closed | $V_m - 0$ |
| − | 1 | Open | Closed | Open | $V_m - V_{REF}$ |

Since the inverted reference signal $V_{REF}$ is positive, and is predetermined to be larger than any analog input signal, when it is subtracted from $V_m$, it yields a negative number. This is appropriate when Q1 is "1" indicating that the original $V_{in}$ was negative.

I claim:

1. A method for conversion of an input analog signal to a digital signal comprising the steps of:
   a) generating a state analog signal in at least one of a plurality of converter stages by combining a stage reference with an stage analog input signal such that the absolute value of the stage analog signal is equal to the sum of the absolute value of the stage reference and the absolute value of the stage analog input signal; and
   b) comparing, in at least one converter stage, the stage analog signal to an analog signal derived from the input analog signal, to generate a respective digital stage output signal.

2. The method of claim 1 further comprising the step of generating a stage analog output signal in at least one stage in response to the respective digital stage output signal.

3. The method of claim 2 further comprising coupling the stage analog output signal to another stage to provide the stage analog input signal to the other stage.

4. The method of claim 3 wherein the stage reference is a different predetermined value for each stage and the stage analog input signal for a first stage is a predetermined reference.

5. The method of claim 2 wherein the stage reference is a different predetermined reference value for each stage, and wherein, in at least one stage, the combining comprises combining the predetermined reference with a stage analog input signal equal to the stage analog output signal of another stage such that the absolute value of the result of the combining is equal to the sum of the absolute value of the stage reference and the absolute value of the stage analog input signal.

6. The method of claim 5 wherein the combining is performed by subtracting the respective stage reference from the stage analog input signal of the respective stage, and wherein the stage analog input signal is a predetermined level for one stage and for any other stages the stage analog input signal is a stage analog output signal from another stage.

7. The method of claim 2 further comprising the step of comparing the analog signal derived from the input analog signal to the stage analog output signal of a preselected stage to generate a signal in response thereto.

8. The method of claim 2 wherein the stage analog output signal for a respective stage is derived from one of the stage analog signal of the respective stage, and the stage analog input signal of the respective stage.

9. The method of claim 8 wherein the stage analog output signal of a respective stage is selected in response to the respective digital stage output signal.

10. The method of claim 2 wherein the respective analog stage output signal is derived from the respective stage analog signal when the respective digital stage output signal is in a first state and is derived from the stage analog input signal when the respective digital stage output signal is in a second state.

11. The method of claim 1 wherein combining a stage reference with a stage analog input signal comprises subtracting the stage reference from the stage analog input signal.

12. The method of claim 11 wherein the stage analog input signal is a positive value and the stage reference is a negative value such that subtracting the stage reference results in the addition of a positive value.

13. The method of claim 1 wherein the analog signal derived from the input analog signal is equal to the input analog signal.

14. The method of claim 1 wherein the plurality of converter stages comprises at least two stages and the steps of generating a stage analog signal and of comparing are performed in at least two stages.

15. The method of claim 1 wherein the plurality of converter stages comprises at least three stages and the steps of generating a stage analog signal and of comparing are performed in at least two stages.

16. The method of claim 1 wherein the absolute value of each stage analog signal is equal to the sum of the absolute value of the respective stage reference and the absolute value of the respective stage analog input signal.

17. The method of claim 1 wherein the analog signal derived from the input analog signal is a modified signal equal to a modified input analog signal modified to have the predetermined polarity when the input analog signal has a polarity opposite the predetermined polarity, and is equal to the input analog signal when the input analog signal has the predetermined polarity.

18. The method of claim 17 wherein the modified signal is equal to the input analog signal shifted by a predetermined amount sufficient to change the polarity of the input analog signal when the input analog signal has a polarity opposite the predetermined polarity.

19. The method of claim 17 further comprising generating a binary sign bit indicative of the polarity of the input analog signal.

20. The method of claim 1 further comprising the step of adapting each digital stage output signal to desired logic levels and coupling the resulting signals to respective digital outputs.

21. Method for converting signals including one of an input analog signal to digital conversion and an input digital signal to analog conversion, comprising the step of:
   a) generating a respective stage analog signal in at least one of a plurality of successive converter stages by combining a respective stage reference with a respective stage analog input signal; and one of the steps of:
   b) comparing, to convert from analog to digital, the respective stage analog signal in at least one converter stage to an analog signal derived from the input analog signal to generate a respective digital stage output signal; and
   c) generating, to convert from digital to analog, a respective stage analog stage output signal in at least two of the plurality of converter stages in response to a respective bit of the digital signal and derived from a plurality of signals including the respective stage analog signal.

22. A method for converting an input digital signal having a plurality of digital bits to a corresponding analog output signal comprising the steps of:
   a) generating a respective stage analog signal in at least one conversion stage of a plurality of conversion stages by combining a respective stage reference with a respective stage analog input signal such that the absolute value of the stage analog signal is equal to the sum of the absolute value of the stage reference and the absolute value of the stage analog input signal;

b) generating a respective stage analog output signal from a plurality of signals including the respective stage analog signal in response to a respective one of the plurality of digital bits.

23. The method of claim 22 further comprising the step of coupling the stage analog output signal of at least one of the stages to another stage to provide the stage analog input signal for that other stage.

24. The method of claim 23 wherein one of the stage analog signal and the stage analog input signal is selected to provide the stage analog output signal responsive to the digital bit.

25. The method of claim 23 wherein the stage analog input signal for a first stage is a predetermined reference value.

26. The method of claim 22 wherein combining comprises summing such that the absolute value of the stage analog signal is equal to the sum of the absolute value of the stage reference and the absolute value of the stage analog input signal.

27. The method of claim 22 wherein the step of generating comprises combining by subtracting one of the stage reference and the stage analog input signal from the other.

28. The method of claim 27 wherein the stage reference value is always negative and is subtracted from a positive stage analog input signal resulting in additional of a positive value to the stage analog input signal.

29. The method of claim 22 further comprising generating a restored analog signal by subtracting one of two values from the stage analog output signal of a preselected stage.

30. The method of claim 29 wherein one of the two values is selected for subtraction in response to a sign bit.

31. The method of claim 22 wherein the respective stage analog output signal is derived from the respective stage analog signal when the respective digital bit is in a first state and comprises the respective stage analog input signal when the respective digital bit is in a second state.

32. An analog to digital converter for converting an analog input signal to a digital signal comprising;
  a plurality of converter stages at least one of which comprises,
    1) a summer circuit having inputs adapted to receive a stage analog input signal as a first input and a stage reference as a second input and having an output configured to provide a stage analog signal derived from a combination of at least the stage reference and the stage analog input signal such that the absolute value of the stage analog signal is equal to the sum of the absolute value of the stage reference and the absolute value of the stage analog input signal;
    2) a comparator configured to receive the stage analog signal and an analog signal derived from the input analog signal, and configured to provide a digital stage output signal as an output responsive to at least the stage analog signal and the analog signal derived from the input analog signal.

33. The converter of claim 32 wherein the summer circuit further comprises an amplifier circuit which provides a sum having a magnitude equal to the magnitude of the stage analog input signal added to the magnitude of the stage reference.

34. The converter of claim 32 wherein the stage reference is of one polarity and the stage analog input signal is of an opposite polarity and summer circuit comprises a difference amplifier which subtracts one of the stage reference and the stage analog input signal from the other.

35. The converter of claim 32 further comprising a switch circuit coupled to the comparator, and having as an output a stage analog output signal responsive to the digital stage output signal.

36. The converter of claim 35 wherein the stage analog output signal is derived from the stage analog signal when the digital stage output signal is in a first state and comprises the stage analog input signal when the digital stage output signal is in a second state.

37. The converter of claim 36 wherein, in at least one stage, the stage analog input signal comprises a stage analog output signal coupled from another stage.

38. The converter of claim 32 wherein the analog signal derived from the input analog signal is equal to the input analog signal.

39. The converter of claim 32 wherein each stage reference is a predetermined reference which is different for each stage.

40. The converter of claim 32 wherein the analog signal derived from the input analog signal is equal to the analog signal shifted by a predetermined amount.

41. The converter of claim 32 wherein the analog signal derived from the input analog signal is equal to the input analog signal when the input analog signal has a first polarity and is equal to the input analog signal shifted by a predetermined amount when the input analog signal has a second polarity.

42. The converter of claim 41 further comprising a polarity detector circuit, coupled to the input, and having as an output a binary sign bit indicative of the polarity of the input analog signal.

43. The converter of claim 32 further comprising a comparator coupled to the analog signal derived from the input analog signal and to the stage analog output signal of a preselected stage, and having an output comparator signal in response thereto.

44. The converter of claim 32 adapted to alternatively convert an input digital signal to a corresponding output analog signal further comprising, in at least one stage, a switch circuit coupled to the summer circuit, and having as an output a stage analog output signal, the switch circuit responsive to a respective bit of the input digital signal.

45. The converter of claim 44 wherein the switch circuit provides the stage analog output signal responsive to the input digital signal in a digital to analog mode and provides the stage analog output signal responsive to the digital stage output signal in an analog to digital mode.

46. The converter of claim 44 wherein the stage analog output signal is derived from the stage analog signal when the respective bit is in a first state and comprises the stage analog input signal when the respective bit is in a second state.

47. An analog to digital converter for converting an input analog signal to a digital signal comprising:
  a) means for generating a stage analog signal in at least one of a plurality of converter stages by combining a stage reference with a stage analog input signal such that the absolute value of the stage analog signal is equal to the sum of the absolute value of the stage reference and the absolute value of the stage input signal; and
  b) means, in at least one of the plurality of converter stages, for comparing the stage analog signal to an analog signal derived from the input analog signal to generate a respective digital stage output signal.

48. The converter of claim 47 further comprising means for generating a stage analog output signal in at least one of the plurality of stages in response to the respective digital stage output signal and means for coupling the stage analog output signal to a following stage to provide the stage analog input signal to the following stage.

49. The converter of claim 48 further comprising means for comparing the analog signal derived from the input analog signal to the stage analog output signal of a preselected stage to generate a signal in response thereto.

50. The converter of claim 47 wherein the analog signal derived from the input analog signal is equal to the input analog signal.

51. The converter of claim 47 further comprising a filter circuit configured to receive the input analog signal and having as an output the analog signal derived from the input analog signal wherein the output of the filter is equal to the input analog signal when the input analog signal has a predetermined polarity and equal to a modified analog signal which is shifted by a predetermined amount when the input analog signal is of a second polarity.

52. The converter of claim 51 wherein the predetermined polarity is positive and the predetermined amount is a reference value at least equal to a maximum input analog signal magnitude.

53. The converter of claim 47 wherein the stage reference is a predetermined value which is different for each stage, and wherein the means for generating performs the combining by subtracting the stage reference from the analog stage input signal.

54. The converter of claim 47 further comprising means for generating a binary sign bit indicative of the polarity of the input analog signal.

55. The converter of claim 47 adapted to alternatively convert an input digital signal to a corresponding output analog signal and further comprising, in at least one stage, means coupled to the means for generating a stage analog signal, for generating a stage analog output signal in response to a respective bit of the input digital signal.

* * * * *